United States Patent [19]

Samuels

[11] Patent Number: 4,457,259

[45] Date of Patent: Jul. 3, 1984

[54] APPARATUS FOR SPRAYING A LIQUID ON A SPINNING SURFACE

[75] Inventor: Gerard Samuels, Paoli, Pa.

[73] Assignee: RCA Corporation, New York, N.Y.

[21] Appl. No.: 475,035

[22] Filed: Mar. 14, 1983

[51] Int. Cl.³ .......................... B05B 3/18; B05B 3/14
[52] U.S. Cl. .................................... 118/705; 118/706; 118/52; 118/56; 118/321; 427/425; 427/240
[58] Field of Search ............... 118/699, 705, 706, 321, 118/52, 56; 427/425, 240

[56] References Cited

U.S. PATENT DOCUMENTS 2,487,111  11/1949  De Koning ........................ 91/45
4,267,212  5/1981  Sakawaki ........................ 427/240

FOREIGN PATENT DOCUMENTS 51-24981  6/1976  Japan .................................. 118/321

*Primary Examiner*—Shrive P. Beck
*Attorney, Agent, or Firm*—Birgit E. Morris; Donald S. Cohen; Joseph D. Lazar

[57] ABSTRACT

A liquid spray apparatus provides predetermined, uniform quantity of liquid (such as photoresist developer) per unit area of surface by a parabolic cam mechanism, arranged to repeatedly reciprocate a nozzle at a predetermined varying linear velocity a plurality of times over a spinning surface, such as a semiconductor device wafer. The mechanism moves the nozzle at a parabolic varying velocity whereby the liquid is deposited at a uniform quantity per unit area. The cam is continuously rotated and engaged with a spring-biased cam follower during the spraying period. The cam follower is engaged and disengaged with the cam by a programable timer defining the spraying period.

5 Claims, 4 Drawing Figures

APPARATUS FOR SPRAYING A LIQUID ON A SPINNING SURFACE

This invention relates to spin spraying apparatus and more particularly to apparatus that provides a spray of developer liquid on a spinning surface.

BACKGROUND OF THE INVENTION

The art of dispensing liquid onto a spinning surface to provide liquid on the surface is widely used in industry. Reference is made to U.S. Pat. No. 4,267,212 issued May 12, 1981 for a "Spin Coating Process" utilizing a dispensing nozzle to apply photoresist radially over a spinning surface. Also see U.S. Pat. No. 2,487,111, issued Nov. 8, 1949 which describes a spraying process in which the flow rate of a viscous liquid containing coating material is varied. A constant velocity cam is utilized to control the spray at the center of the surface to minimize the tendency to accumulate thick coatings at the central portion.

In the semiconductor processing art in which a photoresist developer liquid, such as 100% Waycoat negative photo resist developer, is to be sprayed on a surface of a wafer device, it is highly desireable that a more uniform spray be applied. In order to do this, it is necessary to repeatedly pass a spray nozzle over the surface many times in order to achieve this desired uniformity of spray by providing equal volume per unit area of the liquid.

In one prior art device, the nozzle is reciprocated over the surface by means of a double acting air cylinder which drives the nozzle in a reciprocating diametric path over the wafer surface. The spray volume per unit area of this photoresist developer applied by such mechanism tends to be uneven primarily due to the constant velocity motion characteristics of an air cylinder nozzle moving the nozzle over the surface. Since the nozzle traverses the wafer from a maximum circumference area through a minimum circumference area and again to a maximum circumference area with a constant volume delivery, the applied spray of the developer tends to be heavier towards the center of the wafer and thinner at the outside edges. Moreover, since an air cylinder starts and stops abruptly at its extreme positions (causing sudden high acceleration and deceleration), mechanical vibrations are introduced into the dispensing nozzle resulting in an uneven distribution of the liquid over the wafer surface. This poor distribution is undesireable since non-uniform distribution of the developer tends to cause over-etching during the developing process on the outside of the wafer and, moreover, under-etching at the inside areas. Such undesirable effects obviously reduce the yield of a product line.

There is a need in the art for a spraying apparatus that provides consistently uniform quantities of the liquid repeatedly and reliably over unit areas.

SUMMARY OF THE INVENTION

According to the invention, a system for automatically spraying liquid on a device surface includes a cam driven means for moving a spray nozzle a plurality of times over the surface along a reciprocating diametric path at a predetermined varying linear velocity of the movement of the nozzle, repeated over each respective surface position. This is achieved in the preferred form by providing a cam that has the characteristic of moving the nozzle with a constantly increasing or decreasing linear velocity proportional to time, namely, at a parabolic rate. The cam means includes spring-biased means to impart rapid acceleration of the nozzle at the start of each spraying period.

DETAILED DESCRIPTION OF THE PREFERRED EMBODIMENT OF THE INVENTION

Figure 1:
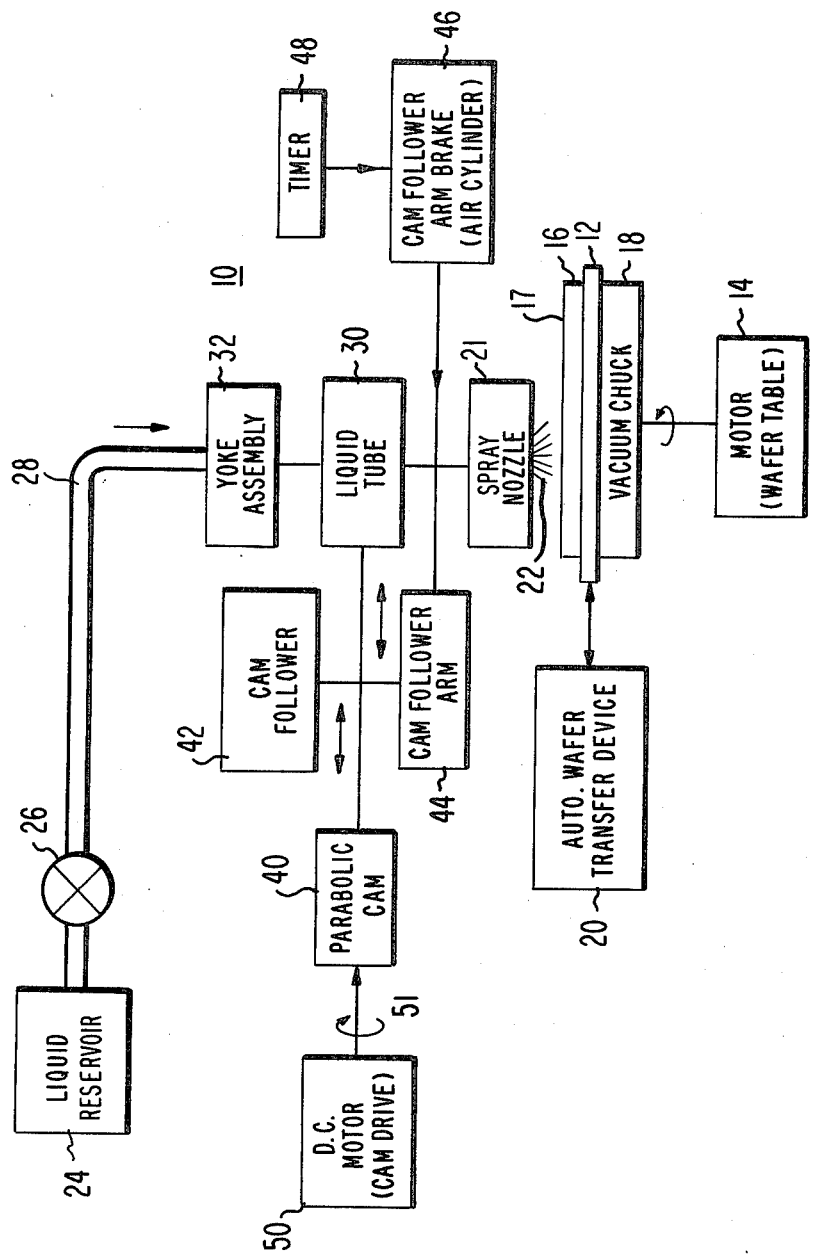
FIG. 1 is a block schematic of the system embodying the invention.
Figure 2:
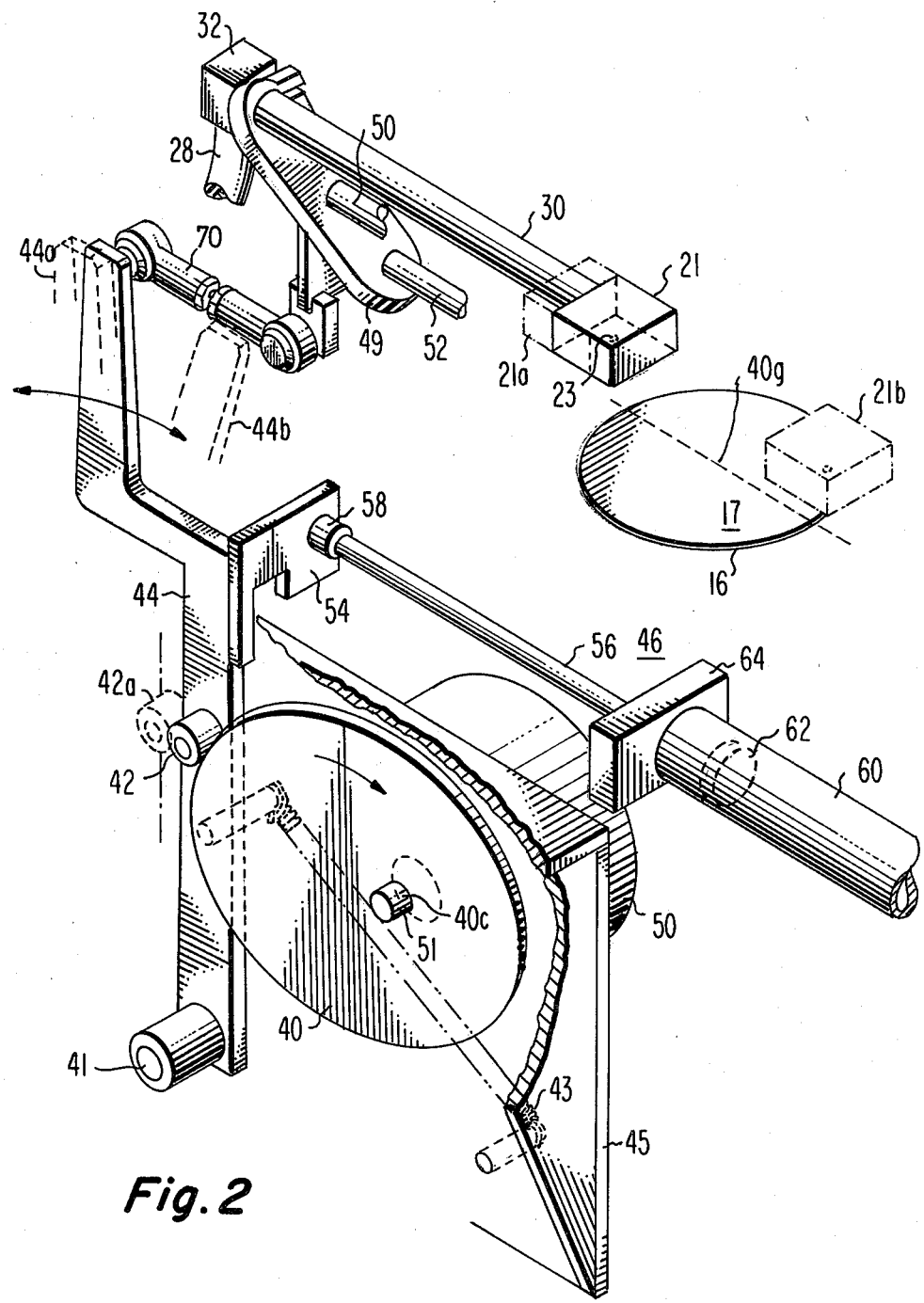
FIG. 2 is an exploded view in perspective showing the drive mechanism of the invention.

The apparatus of the invention is embodied in a system shown in block schematic form in FIG. 1 and shown in exploded perspective form in FIG. 2. The system 10 includes a rotatable table 12 rotated by a motor 14. The motor is driven at a predetermined constant rate of rotation so that the support 12 carrying a wafer 16 will rotate the wafer at that rate. A vacuum chuck 18 holds the wafer in position on the table 12. Automatic wafer transfer device 20 may be provided to automatically move wafers 16 in sequence for spraying over the table 12. A dispensing nozzle 21 providing a spray 22 of liquid over the surface 17 of the wafer is supplied with photoresist developer liquid from a pressurized reservoir source 24 via a control valve 26 through a supply hose 28 and thence through a rigid tube 30 supported by a yoke assembly 32. The rate of flow of the liquid spray is substantially constant. The rigid tube 30 serving as an arm supports the nozzle 21 which is reciprocated over the wafer 16 by the rotary action of a rotating parabolic cam 40 driving a cam follower arm 44 through a cam follower 42. The parabolic cam 40 causes the nozzle 21 to be moved linearly over the surface at a velocity that is changed at a constant rate as will be explained in detail hereinafter. The cam follower arm 44 is disengaged from the cam 40 by means of a brake 46 actuated by a double acting air cylinder 60. The brake 46 is controlled by a programable timer 48. The motor 14 rotates (via the table 12) the wafer 16 continuously before the cam follower 42 is engaged with the cam 40.

A tension spring 43 spring biases, via arm 44, the cam follower 42 to maintain positive contact with the cam 40 in the engaged position. Moreover, spring 43 serves a significant function in providing starting momentum to the mechanism from the disengaged rest position (represented in dotted lines by the position of cam follower 42a, arm 44a and nozzle 21a) to the initial engaged position when the cam follower 42 strikes the edge of the cam 40 (as shown in solid lines). Thus, as the brake 46 releases the arm 44 from the rest position 44a, the nozzle 21 is started from its rest position 21a to essentially its predetermined spraying velocity over the wafer surface by the action of the spring 43.

The parabolic cam 40 is rotated by a d.c. motor 50 continuously at a fixed rate selected, in one embodiment, from within the range of about 5 to 125 r.p.m., but preferably at about 75 r.p.m. Motor 50 is preferably the d.c. type to allow for fine speed control. It should be able to provide adequate torque to easily drive the mechanism. The nozzle 21, having an aperture 23 of about 5 mil in diameter and formed of sapphire provides the spray 22 over the surface 17 through a gap of about a 0.5 inch (1.25 cm). The nozzle 21 is reciprocated over the surface at about 150 strokes a minute (2 strokes per revolution of cam 40) at a rate of two strokes per 0.8 second, thereby spraying each wafer 16 approximately 135 times per spray cycle.

The cam 40, mounted on motor shaft 51 of motor 50 and attached to support plate 45, as seen best in FIG. 2, engages the cam follower 42, in the position shown in solid line. The cam follower 42 is mounted on a cam follower arm 44 pivoting about an axis 41. The cam 40, cam follower 42 and supply tube 30 are formed of stainless steel. The material of the other structural elements of the apparatus are generally formed of aluminum. Cam 40 drives the lever arm 44, when in contact with the cam follower 42, to reciprocate the nozzle 21 via a linkage 70, suitably an adjustable length swivel arm, and thence to a bracket 49 supporting the yoke assembly 32 carrying the tube 30. The bracket 49 is guided on two guide rods 50 and 52 through two linear bearings (not shown) to constrain the movement of the mechanism to a predefined linear reciprocating path.

The brake 46 includes a dog 54 which is rigidly connected to the arm 44. The dog 54 is engaged to and disengaged from a piston rod head 58 formed of plastic, attached to a piston rod 56, which, in turn, is coupled to a piston 62 of an air cylinder 60. The air cylinder 60 in turn is supported to the base of the apparatus by support bracket 64. The air cylinder 60 is suitably of the double-acting type so that air is applied alternately upstream and downstream of the piston 62 to effect rapid action and movement of the piston rod 56.

Tension spring 43, attached to motor support plate 45 and connected to the arm 44 keeps the cam follower 42 in engagement with the surface of the cam 40 during the spraying mode. When actuated, via timer 48, the brake 46 drives the arm 44, via dog 54, away from the cam 40 thereby terminating any movement of nozzle 21 effected by the cam 40. Cam follower 42 is moved, in one example, approximately 3/16" away from the cam face point 90, (shown in FIG. 3 to be described) to terminate nozzle reciprocating action. This disengaging action occurs at the end of every timed spraying cycle. When a wafer 16 is to be sprayed in place on the support 12, the air cylinder 60 is operated to withdraw the piston head 58 from the dog 54 allowing the cam follower 42 to engage the face of the cam 40 and thereby start again the reciprocating action of the arm 30 carrying the nozzle 21.

Figure 3:
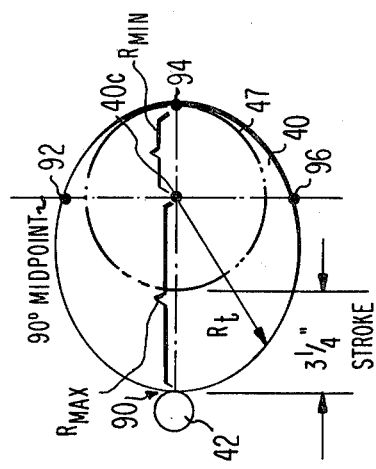
FIG. 3 is a side view of the cam.

Reference is made to FIG. 3 illustrating, in side view, a form of the parabolic cam 40. The cam 40 has two zero velocity points, 90 and 94, which are respectively 180° from each other. The cam center 40c is coaxial with the shaft axis 51 and with the center of the cam base circle 47 (shown in phantom line in FIG. 3). The velocity curve (as known in the art to represent one of the characteristics of the periphery of the cam 40) is generated about the cam base circle 47. The instantaneous cam radius is defined by $R_t$. The reversal points of velocity changes of the nozzle 21 correspond to cam points 90, 92, 94 and 96. The cam points 90 and 94 define the extremum of the stroke. Whenever the cam follower 42 engages the cam 40, the cam follower arm 44 and connecting mechanism will cause the nozzle 21 to be positioned at a position corresponding to the instantaneous position of the cam relative to the cam follower 42. In addition, the nozzle 21 will be moved at a velocity determined by the angular position of the cam 40 relative to the follower 42. This cam-driven velocity may be larger or smaller than the velocity at which the nozzle 21 was moving responsive to the tension spring 43 released by brake 46 before the follower 42 contacted the cam 40. The velocity of nozzle 21 will be reduced to zero if the cam 40 is in position 90 when contacted by follower 42. At some position, not easily determinable, the nozzle 21 will be moving at a velocity equal to the cam-driven velocity. Nevertheless, the cam profile determines and controls the velocity of the nozzle 21 when contact to the cam is made. Thus, the nozzle 21 will be moved back and forth over the wafer at a linearly varying velocity between the extremes of the zero velocity points 90 and 94 and maximum velocity at points 96 and 92.

Figure 4:
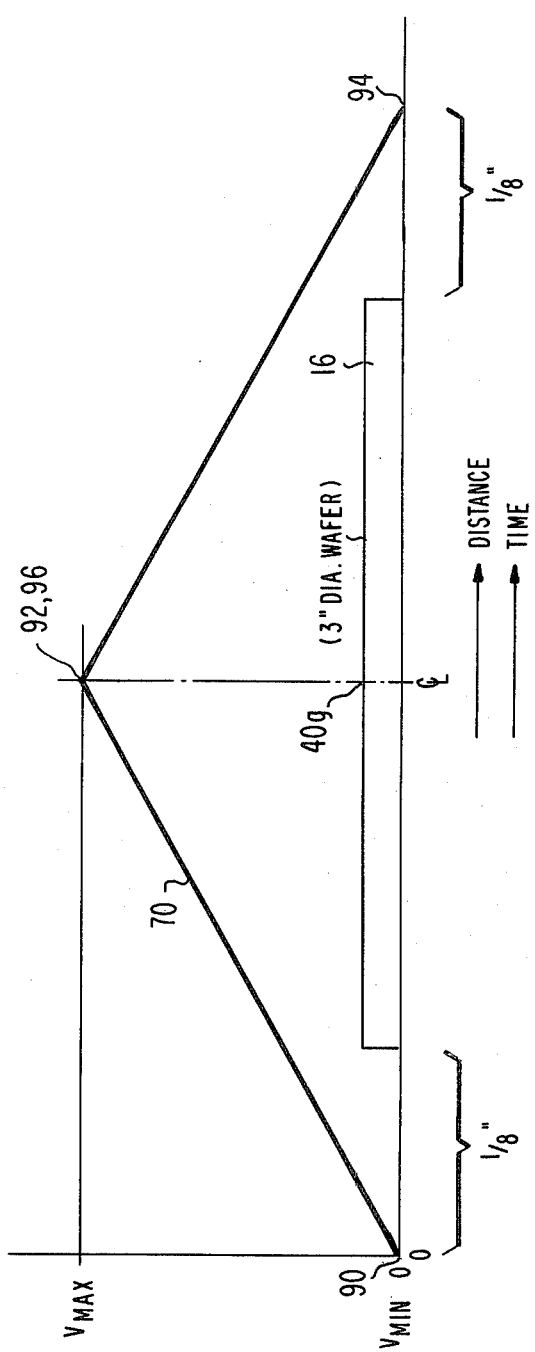
FIG. 4 is a plot of nozzle velocity as a function of the distance or position over the wafer.

Reference is made to FIG. 4 which shows a curve plot 70 of the linearly increasing and decreasing velocity rate of the nozzle 21 that is defined by the parabolic cam 40. Plot 70, known in the cam art as a velocity curve, is used to define the profile of the cam 40, as mentioned hereinabove. Plot 70 shows that the velocity of the nozzle 21 will be zero ($V_{min}$) when points 90 or 94 of the cam 40 are in contact with the follower 42. Also, the nozzle velocity will be maximum when cam points 92 or 96 are in contact with the follower 42 and the nozzle 21 is over the center 40g of the wafer 16. This cam characteristic causes the developer liquid to be distributed more evenly across the surface 17 of the rotating wafer 16.

With the start of a spraying cycle, the cam follower arm 44 is released as the double-acting air cylinder 60 withdraws its piston rod head 58. Due to the action of the tension spring 43, the cam follower arm 44 is pulled towards the constantly rotating cam 40 until cam follower 42 makes contact with the cam face of cam 40.

In practice, the extreme positions of the nozzle 21, are beyond (about ⅛") the periphery of the wafer 16. Accordingly, when so-arranged the nozzle 21 will have a velocity somewhat greater than zero as it is moved over the edge of the wafer.

Consider first the special case. If at the instant of contact between cam follower 42 and cam 40, point 90 is the contact point on the rotating cam, nozzle 21 will have moved from its rest position 21a (FIG. 2) about ½ inch towards the wafer due to the action of tension spring 43. Also, nozzle aperture 23 will be ⅛ inch to the left of wafer periphery. At this moment, cam follower 42 and nozzle 21 will have an instantaneous velocity of zero. Instantaneously, the cam follower 42 will follow the contour of rotating cam 40 so that nozzle aperture 23 will experience a linearly increasing velocity (as a function of time and, also of the distance over the wafer surface), until the cam follower 42 is in contact at cam point 96 on the constantly rotating cam 40. At this time, the nozzle aperture 23 is at the midpoint 40g of wafer 16, with maximum instantaneous velocity ($V_{max}$). As cam 40 continues to rotate in the arrow direction shown on FIG. 2, the cam follower 42 will be in contact with point 94 on the face of rotating cam 40. At that instant, cam follower 42 and nozzle 21 will be again at zero velocity ($V_{min}$) with nozzle aperture 23 ⅛ inch to the right of the periphery of rotating wafer 16. The return stroke of nozzle 21 will experience an identical path, starting from zero velocity ($V_{min}$) at cam point 94 and going through maximum velocity ($V_{max}$) when cam follower 42 is in contact with point 92 on the rotating cam 40 at which the nozzle aperture 23 crosses the midpoint 40g of surface 17 of rotating wafer 16. As the cam follower 42 approaches point 90 on the face of rotating cam 40, the cam follower 42 and nozzle 21 will again be at zero velocity ($V_{min}$). Nozzle aperture 23 at this time is again ⅛ inch to the left of the wafer periphery, and at this point a new forward stroke over the wafer 16 is ready to start.

Consider now the general case. If at the instant of contact between cam follower 42 and cam 40, the initial contact point is any point except 90 (thus any random position), then, cam follower 42 and nozzle 21 will have travelled at least ⅛ and ¼ inch, respectively. Depending on the rotative position of the cam 40, the initial travel of the spray nozzle 21 can be as much as 3¾ inches, and about 1 3/16 inches for the cam follower 42. In any case, regardless of where the cam follower 42 meets the face of the rotating cam 40, the spray nozzle 23 immediately assumes the precise velocity that the cam design dictates (as illustrated by the velocity plot 70, FIG. 4).

The operation of the system should now be apparent from the above description of the system. In brief, the wafer 16 is placed in position on the support 12 and the vacuum chuck 18 holds it in position. With the wafer rotating and the system ready to operate according to a predetermined program, the valve 26 is operated to allow the developer liquid to pass through the aperture 23 of nozzle 21 and the air brake 46 is released to allow the cam follower 42 to contact the cam 40. Thus arm 44 from position 44a (shown dotted) moves rapidly by spring action upon brake release to a position shown in solid line depending on the cam 40 position. The cam 40 then drives the nozzle 21 in reciprocating manner across the surface 17 of the wafer 16 at a rate of about 150 strokes per minute for about 135 strokes during a 55 second spraying period (under control of timer 48) during which the nozzle 21 will provide a liquid spray twice over the surface 17 for each reciprocating action as the wafer 16 is rotated thereunder. The distal positions of the stroke are represented by dotted lines for the position of nozzle 21b and arm 44b. At the end of a spray cycle, of about 55 seconds, the brake 46 disengages the cam follower 42 from the cam 40 thereby driving the nozzle 21 away from the surface area of the wafer 16 to position 21a (shown dotted). The automatic transfer device 20 then replaces wafer 16 that has been developed with a new wafer to be developed. When the replacing wafer is in place, the mechanism repeats the spraying cycle automatically.

According to the invention, cam 40 is rotated continuously at a constant angular velocity whereby the nozzle 21 is reciprocally moved over the surface by the parabolic cam 40 at a uniformly changing rate to effect a substantially uniform volume of liquid spray per unit area. The nozzle 21 is initially moved from rest at a very rapid acceleration by the action of spring 43 to have, when the cam follower 42 strikes the cam 40, a velocity that approaches the velocity determined by the cam curve 70 and the position of the cam follower 42 on the cam curve. Thus, the nozzle 21 will have substantially uniform velocity changes throughout the entire spray period. Any deviation from this velocity change uniformity induces undesirable spray variations of the developer on the wafer causing non-uniformity of wafer etching. Moreover, when the actuating levers are stopped and started by the overriding mechanism, the nozzle 21 may be at any point above the wafer 17. However, it has been found that since there are approximately 135 spray strokes per cycle during each spray period, any starting and stopping of the spray cycle within the wafer area does not result in uneven etching.

It should be noted that the wafer is rotated at a constant rate and the flow of liquid through nozzle 23 also is at a constant rate. Accordingly, if the linear velocity of the nozzle over the rotating surface was kept constant (as in the prior art), the volume of liquid per unit area would not be uniform. For example, the peripheral wafer surface moving at a faster angular velocity under the nozzle will receive less liquid per square than the inner surfaces of the wafer. By moving the nozzle 23 more slowly in the peripheral portions and more rapidly in the center portions (actually at a maximum rate at the wafer center 40g, for example, the maximum velocity points 92 and 96 in FIG. 4), the liquid is sprayed more uniformly per square. The preferred parabolic rate of change in velocity, according to this invention, achieves uniform spraying per square.

While the embodiment described provides for a parabolic cam, other embodiments of the invention may indicate that another type of cam be used. The rate of deposition will, of course, depend on the cam shape.

What is claimed is:

1. In a system for automatically spraying liquid on a device surface rotated at a constant rate including means for moving a spray nozzle over said surface whereby the liquid is dispensed in a spray under high pressure over said surface along a reciprocating linear path, characterized by:

cam means for moving said nozzle a plurality of times over said surface along said reciprocating diametric path at a predetermined velocity of nozzle movement;

said cam means including spring biased means for keeping a continuously rotating cam in engagement with a cam follower during a first time period; and means for automatically interrupting said reciprocating action at predetermined intervals to discontinue the movement of said nozzle over said surface; and to position the nozzle at a rest position away from said surface;

said interrupting means including means to disengage said cam follower from said cam, and, subsequently, to re-engage said cam and said cam follower by said spring biased means such that the nozzle is moved rapidly from said rest position towards said surface to repeat said reciprocating movement;

whereby said surface is sprayed with a predetermined quantity of liquid per unit surface area.

2. The system of claim 1 wherein said cam means includes a parabolic cam and a spring-biased cam follower linked to said nozzle and arranged so that each respective angular position of said cam corresponds to a predetermined corresponding position of said nozzle over said surface, said nozzle being moved over said surface at a parabolic rate such that its velocity is changing at a constant rate, whereby the liquid is sprayed over said surface at a substantially uniform quantity per unit area.

3. The system of claim 2 wherein said cam is continuously rotated by a d.c. motor.

4. The system of claim 1 further including means to automatically and repeatedly replace said device after each predetermined spraying interval with other devices to be sprayed.

5. The system of claim 4 wherein said interrupting means includes air piston means for separating and re-engaging said cam and cam follower to thereby automatically and repeatedly move said nozzle over each replacing device at said predetermined instantaneous velocity.

* * * * *